(12) United States Patent
Gabrani et al.

(10) Patent No.: US 8,946,630 B2
(45) Date of Patent: Feb. 3, 2015

(54) AUTOMATIC FILTERING OF SEM IMAGES

(71) Applicant: International Business Machines Corporation, Armonk, NY (US)

(72) Inventors: Maria Gabrani, Thalwil (CH); Virginia Estellers, Lausanne (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/853,123

(22) Filed: Mar. 29, 2013

(65) Prior Publication Data

US 2014/0291513 A1    Oct. 2, 2014

(51) Int. Cl.
| | |
|---|---|
| *H01J 37/28* | (2006.01) |
| *G06T 7/00* | (2006.01) |
| *G06K 9/46* | (2006.01) |
| *G06K 9/62* | (2006.01) |

(52) U.S. Cl.
CPC .............. *G06T 7/001* (2013.01); *G06K 9/4604* (2013.01); *G06K 9/6202* (2013.01); *H01J 37/28* (2013.01)
USPC ........ 250/311; 250/306; 250/307; 250/492.1; 250/492.3

(58) Field of Classification Search
USPC .................... 250/306, 307, 311, 492.1, 492.3
See application file for complete search history.

(56) References Cited

U.S. PATENT DOCUMENTS

| | | | | |
|---|---|---|---|---|
| 2012/0267528 A1* | 10/2012 | Sakai et al. | .................... | 250/307 |
| 2012/0292503 A1* | 11/2012 | Phifer et al. | .................... | 250/307 |
| 2012/0298862 A1* | 11/2012 | Chen et al. | .................... | 250/307 |

OTHER PUBLICATIONS

Adalsteinsson et al., "The Fast Construction of Extension Velocities in Level Set Methods", The Journal of Computational Physics, Dec. 1997, pp. 1-27.
Burt et al., "The Laplacian Pyramid as a Compact Image Code", IEEE Transactions on Communications, vol. Com-31, No. 4, Apr. 1983, pp. 532-540.
Caselles et al., "Geodesic Active Contours", International Journal of Computer Vision, vol. 22, No. 1, 1997, pp. 61-79.
Chan et al., "Active Contours Without Edges", IEEE Transactions on Image Processing, vol. 10, No. 2, Feb. 2001, pp. 266-277.
Chan et al., "Algorithms for Finding Global Minimizers of Image Segmentation and Denoising Models", SIAM J. Appl. Math., vol. 66, No. 5, 2006, pp. 1632-1648.
Feng et al., "Dynamic self-inspection of integrated circuit pattern defects", J. Vac. Sci. Technol. B, vol. 22, 2004, pp. 3373-3377.
Feng et al., "Pattern resconstruction of scanning electron microscope images using long-range content complexity analysis of the edge ridge signal", J. Vac. Sci. Technol. B, vol. 24, 2006, pp. 3110-3114.
Feng et al., "Segmentation-Assisted Edge Extraction Algorithms for SEM Images", Proc. of SPIE, vol. 6349, 2006, pp. 1-10.

(Continued)

*Primary Examiner* — Nicole Ippolito
*Assistant Examiner* — Hanway Chang
(74) *Attorney, Agent, or Firm* — Cantor Colburn LLP; Daniel Morris

(57) ABSTRACT

A method, system, and computer program product to automatically evaluate a scanning electron microscope (SEM) image are described. The method includes obtaining a source image and the SEM image taken of the source image. The method also includes evaluating the SEM image based on comparing source contours extracted from the source image and SEM contours extracted from the SEM image to determine whether the SEM image passes or fails.

7 Claims, 4 Drawing Sheets

(56) References Cited

OTHER PUBLICATIONS

Feng et al., "Reconstruction of pattern images from scanning electron microscope images", J. Vac. Sci. Technol. B, vol. 23, No. 6, Nov./Dec. 2005, pp. 3080-3084.

Frangi et al., "Multiscale Vessel Enhancement Filtering", Medical Image Computing and Computer-Assisted Interventation, vol. 1496, 1998, pp. 130-137.

Goldenberg et al., "Fast Geodesic Active Contours" IEEE Transactions on Image Processing, vol. 10, No. 10, Oct. 2001, pp. 1467-1475.

Goldstein et al., "The Split Bregman Method for L1-Regularized Problems", SIAM J. Imaging Sciences, vol. 2, No. 2, 2009, pp. 323-343.

Haidinyak et al., "Applications Using 2D Contact CDSEM Images", Proceedings of SPIE, vol. 5567, 2004, pp. 732-740.

Lempitsky et al., "Global Optimization for Shape Fitting", IEEE Conference on Computer Vision and Pattern Recognition, 2007, pp. 1-8.

Midoh et al., "Boundary extraction in the SEM cross section of LSI by multiple Gaussian filtering", Proceedings of SPIE, vol. 5606, 2004, pp. 169-173.

Morokuma et al., "A new matching engine between design layout and SEM image of semiconductor device", Proceedings of SPIE, vol. 5752, 2005, pp. 546-558.

Rockafellar, R. Tyrrell, "Lagrange Multipliers and Optimality", SIAM Review, vol. 35, No. 2, Jun. 1993, pp. 1-56.

Shibahara et al., "A CD-Gap-Free Contour Extraction Technique for OPC Model Calibration", Proc. of SPIE, vol. 7971, 2011, pp. 1-8.

Shindo et al., "High-precision contouring from SEM image in 32-nm lithograph and beyond", Proc. of SPIE, vol. 7275, 2009, pp. 1-9.

Shishido et al., "CD bias reduction in CD-SEM of very small line patterns: sidewall shape measurement using model-based library matching method", Proc. of SPIE, vol. 7638, 2010, pp. 1-13.

Tabery et al., "Evaluation of OPC Quality using Automated Edge Placement Error Measurement with CD-SEM", Proc. of SPIE, vol. 6152, 2006, pp. 1-10.

Tabery et al., "SEM Image Contouring for OPC Model Calibration and Verification", Proc. of SPIE, vol. 6520, 2007, pp. 1-11.

Villarrubia et al., "Proximity-associated errors in contour metrology", Proc. of SPIE, vol. 7638, 2010, pp. 1-11.

Villarrubia et al., "Dimensional Metrology of Resist Lines using a SEM Model-Based Library Approach", Proceedings of SPIE, vol. 5375, 2004, pp. 199-209.

Villarrubia et al., "Sensitivity of SEM width measurements to model assumptions", Proc. of SPIE, vol. 7272, 2009, pp. 1-15.

Wang et al., "A New Alternating Minimization Algorithm for Total Variation Image Reconstruction", SIAM Journal on Imaging, 2008, pp. 1-24.

Wu et al., "Augmented Lagrangian Method, Dual Methods, and Split Bregman Iteration for ROF, Vectorial TV, and High Order Models", SIAM J. Imaging Sciences, vol. 3, No. 3, 2010, pp. 300-339.

\* cited by examiner

AUTOMATIC FILTERING OF SEM IMAGES

BACKGROUND

The present invention relates to scanning electron microscope (SEM) images, and more specifically, to automatic filtering of SEM images.

SEM images are used in many applications. In one exemplary application, data from SEM images is used to build optical proximity correction (OPC) models that are used in optical lithography to optimize the printing process from layout masks to silicon wafers. The SEM images are currently obtained and verified (quality checked) manually to determine if they are proper candidates with which to generate the OPC models. However, because thousands of SEM images may be used to build the OPC models, manual verification or filtering of the SEM images can become time-consuming and error prone.

SUMMARY

According to one embodiment of the present invention, a method of automatically evaluating a scanning electron microscope (SEM) image includes obtaining, using a processor, a source image; obtaining, at the processor, the SEM image taken of the source image; and evaluating, with the processor, the SEM image based on comparing source contours extracted from the source image and SEM contours extracted from the SEM image to determine whether the SEM image passes or fails.

According to another embodiment of the present invention, a system to obtain and evaluate a scanning electron microscope (SEM) image includes a scanning electron microscope (SEM) to obtain the SEM image from a patterned source; a processor configured to evaluate the SEM image based on a source image obtained from the patterned source by comparing source contours extracted from the source image with SEM contours extracted from the SEM image; and an output device configured to output evaluation information to a user.

According to yet another embodiment of the present invention, a computer program product for evaluating a scanning electron microscope (SEM) image comprises a computer readable storage medium having program code embodied therewith, the program code being readable and executable by a processor to perform a method, The method including receiving a source image; receiving the SEM image taken of the source image; and evaluating the SEM image based on comparing source contours extracted from the source image and SEM contours extracted from the SEM image to determine whether the SEM image passes or fails.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 2:
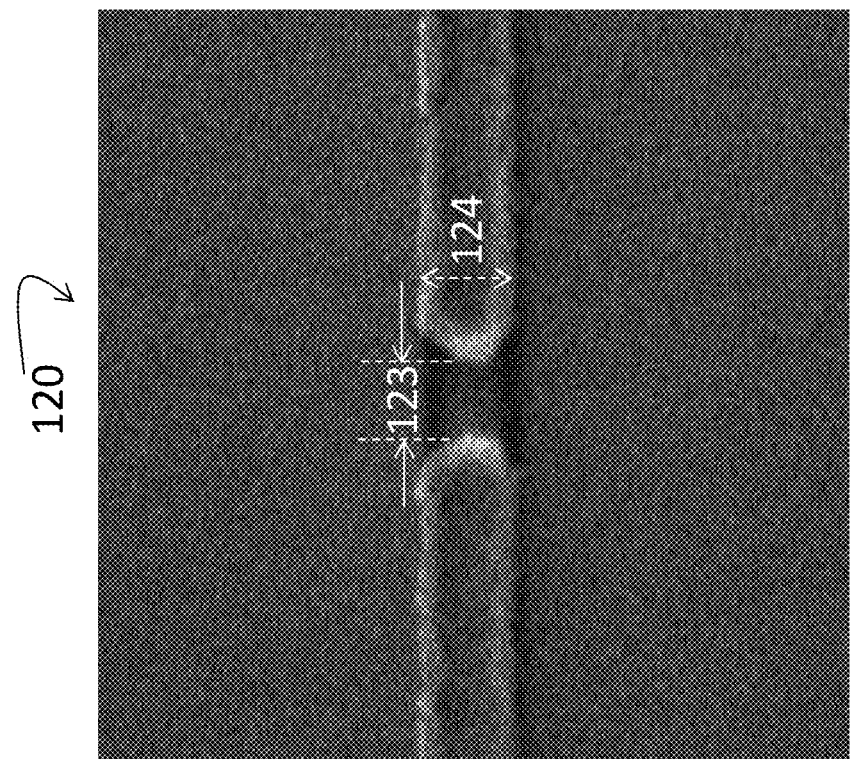
FIG. 2 shows an exemplary SEM image generated from the mask pattern of FIG. 1.
Figure 1:
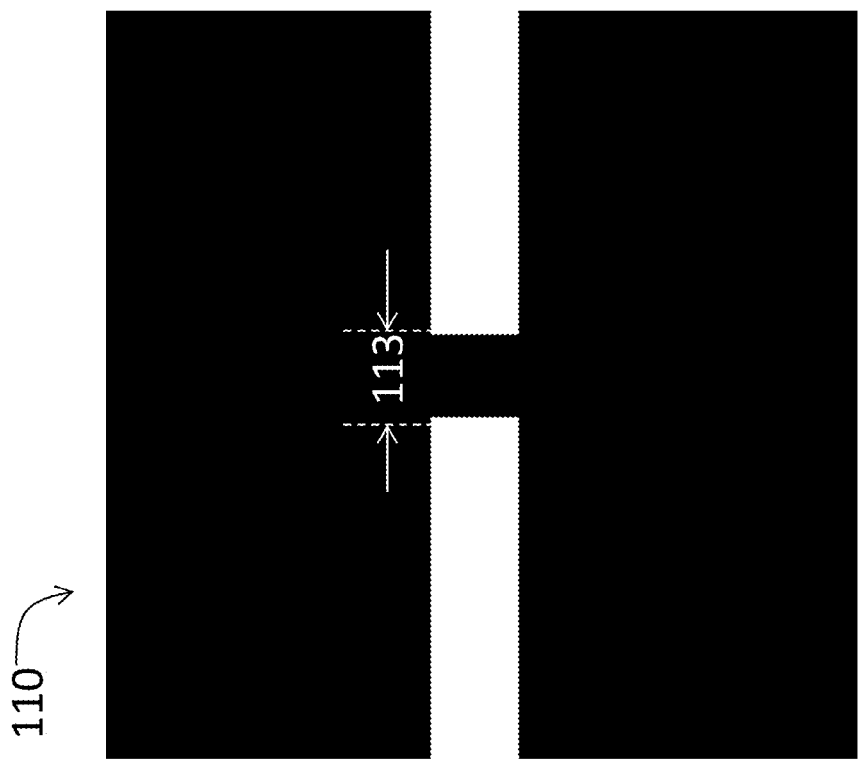
FIG. 1 shows an exemplary mask pattern used to perform SEM filtering according to embodiments of the invention.

As noted above, one application for scanning electron microscope (SEM) images is in the development of optical proximity correction (OPC) models which are used in the chip manufacturing process development phase to enhance the resolution of the mask. Current verification of the SEM images to determine suitability for building OPC models involves a time-consuming manual process. Embodiments of the invention described herein include a system and method for automatic SEM image filtering. While the embodiments are detailed with reference to the specific example of the OPC model development application, the embodiments apply, as well, to quality verification of SEM images for any application. That is, while exemplary embodiments detailed herein relate to verifying SEM images obtained from mask patterns, SEM images obtained from another source may be verified using that source in the way that the mask is described as being used herein. FIG. 1 shows an exemplary mask pattern 110 used to perform SEM filtering according to embodiments of the invention. The exemplary mask pattern 110 includes a distance 113 between two patterns as shown by FIG. 1. FIG. 2 shows an exemplary SEM image 120 generated from the mask pattern 110 of FIG. 1. As a comparison of FIG. 1 and FIG. 2 shows, the exemplary SEM image 120 has a distance 123 between patterns and a width 124 for the corresponding white band from the mask pattern 110 of FIG. 1.

Figure 3:
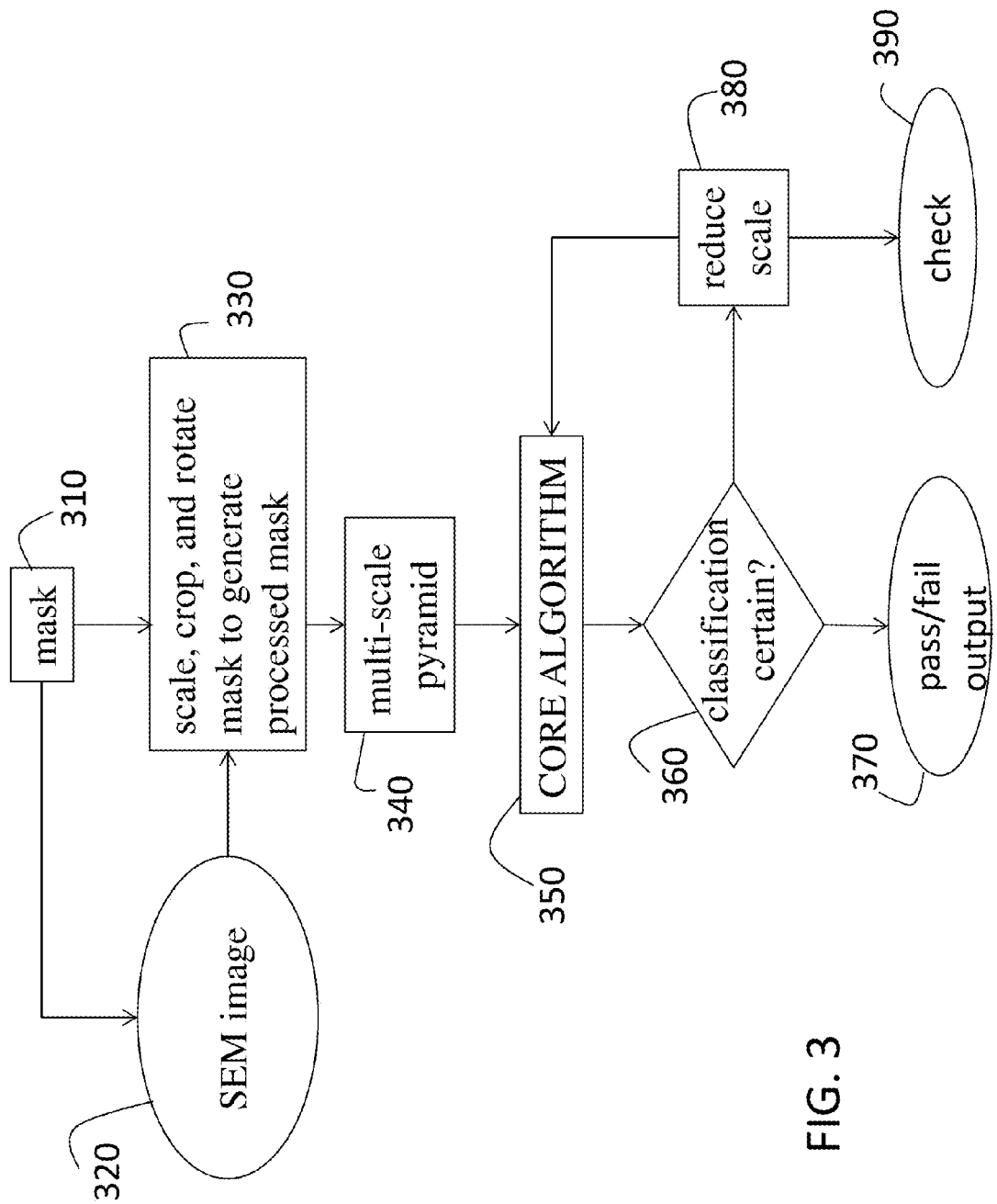
FIG. 3 is a flow diagram of a process of automatic SEM filtering according to an embodiment of the invention.

FIG. 3 is a flow diagram of a process of automatic SEM filtering according to an embodiment of the invention. The process includes selecting mask patterns 110 to use in generating OPC models. For example, critical mask patterns 110 in the chip manufacturing may be selected. SEM images 120 are generated from the mask patterns 110 at block 320. At block 330, the process includes scaling, cropping, and rotating the mask patterns 110 to generate processed masks 115 to match the size and orientation of structures visible on the corresponding SEM images 120. The multi-scale pyramid process 340 adjusts the resolution of the processed masks 115 and corresponding SEM images 120. A multi-scale representation of the SEM images 120 may be obtained by iterative Gaussian smoothing of the original SEM images 120. This results in a series of images of the same size but lower resolutions. An equivalent representation may be obtained by down-sampling the original SEM images 120 with a fast pyramidal scheme, thereby reducing the size of the images without losing information that is relevant to the scales. As a result of the down-sampling, the reduced size of the data and variables of the algorithm facilitate faster processing at larger scales (lower resolutions). Initially, the coarsest resolution may be used, and the large scales may be sufficient to verify many of the SEM images 120. The largest scale at which a particular SEM image 120 may be processed depends on the associated pattern of the SEM image 120. That is, a relatively simple pattern requires a lower resolution than a relatively more complicated pattern. Determination of the necessary scale may be automated by analyzing the minimum distance between contours of a given processed mask 115 (discussed below) for each pattern and the average width (e.g., 123, FIG. 1) of the white bands for the SEM images. The core algorithm, detailed below, is performed at block 350 to provide contours of the processed mask 115 and corresponding SEM images 120 for comparison. At block 360, a determination is made as to whether a classification (of whether the SEM image 120 passes or fails) made as part of the core algorithm (350) is done with a specified degree of certainty. The degree of certainty may be specified by a user and may be the same for all mask patterns 110 or may be changed for different mask patterns 110 based on their criticality, for example. If a determination can be made with the required certainty, the classification of the SEM image 120 (pass or fail) is output at 370. On the other hand, if it is determined at block 360 that a classification cannot be made at the current scale (image resolution), then the scale is reduced (resolution is increased) at block 380 and the core algorithm (block 350) is performed again. When a classification cannot be made (block 360), but the scale is already the lowest (highest resolution), then a check is done at block 390 and a user alert may be issued for manual classification of the particular SEM image 120.

Figure 4:
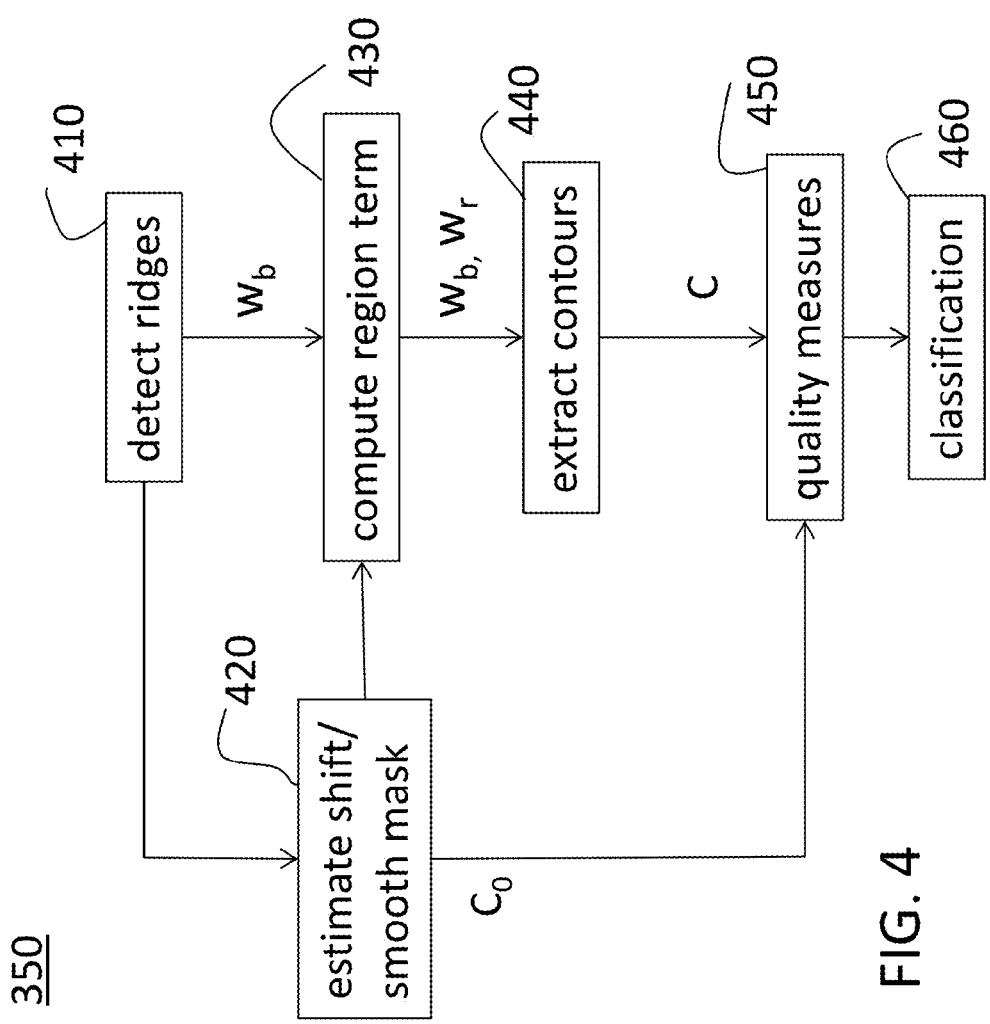
FIG. 4 details the core algorithm process shown in FIG. 3.

FIG. 4 details the core algorithm process 350 shown in FIG. 3. As detailed below, the core algorithm may be regarded as having two stages. The first fits contours on ridges of each SEM image 120, and the second compares these contours with contours from the corresponding processed mask 115 to determine if the SEM image 120 passes or fails according to specified quality measures. Ridges may be thought of as edges of interest. Ideal edge detection yields a set of connected curves that indicate boundaries of objects (contours), but real-world noisy images provide edges that are fragmented and suffer from false detections. Contours are one-dimensional curves associated with boundaries of objects in an image. Detecting ridges (block 410) from the SEM images 120 may include implementing a known technique such as using a multi-scale ridge detector to detect edges directly from the SEM images 120. Detecting ridges (410) may be done in terms of an eigenvector or eigenvalues of a Hessian matrix of the SEM images 120. A boundary term weights the length of the contour (C) of the SEM image 120 with an inverse ridge detector $w_b$ according to the following:

$$\min_{C \subset \Omega} \int_C w_b(s) \, ds \quad \text{[EQ. 1]}$$

where $\Omega$ is the image domain, s is the arc-length parameterization, and $w_b$ is the ridge detector.

At block 420, the core algorithm (350, FIG. 3) includes estimating a shift between the processed mask 115 and the corresponding SEM image 120 and smoothing the processed mask 115. As noted above, the pattern mask 110 is cropped, scaled, and rotated to match the image size obtained for the corresponding SEM image 120. After this processing, there is still a possibility of a shift between the processed mask 115 and the corresponding SEM image 120. To address the shift, a coarse alignment technique may estimate the shift $(x_0, y_0)$ between the processed mask 115 and the corresponding SEM image 120 as follows:

$$(x_0, y_0) = \operatorname*{argmax}_{x_t, y_t} \int_\Omega I(x, y) \cdot C_0(x + x_t, y + y_t) \, dx - \lambda \sqrt{x_t^2 + y_t^2} \quad \text{[EQ. 2]}$$

where I is the SEM image 120, C0 are the contours of the shifted processed mask 115, and $\lambda$ is a positive parameter designed to penalize large shifting. Photolithography results in a low-pass filtering process of the expected shapes. This necessitates smoothing of the initial contours obtained from the processed mask 115. Smoothing the processed mask 115 may include using a Gaussian kernel, with the size of the kernel being estimated from the width of the white bands (see e.g. 123 in FIG. 2) in the SEM image 120. The smoothing process results in the contours ($C_0$) for the patterned mask 110 that will be compared with the contours (C) for the corresponding SEM images 120. In an alternate embodiment, contours ($C_0$) may be obtained from an Aerial Image (simulated version of how the patterned mask 110 structure is expected to print) based on the previous cycle model.

At block 430, computing the region term ($w_r$) involves both the SEM images 120 and the corresponding mask 115. This is because SEM images 120 do not include any additional information. Thus, prior knowledge about the expected patterns in an SEM image 120 (based on the corresponding processed mask 115) is used to compute the region term ($w_r$). The region term ($w_r$) makes the contour (C) of the SEM image 120 robust to noise.

At block 440, extracting contours (C) from an SEM image 120 utilizes a convex segmentation model. The contour fitting is formulated as a minimization associated with geodesic active contours (GAC) and active contours without edges (ACWE) models. To speed up the algorithm and assure convergence, the convex level set formulation of ACWE is adopted but the minimization is performed with faster and more efficient schemes from imaging. The contour is implicitly represented as the zero level set of a higher dimensional function, called the level set function. The segmentation model is defined as the following energy minimization problem with respect to contour C:

$$\min_{C \subset \Omega} \int_C w_b(s) \, ds + \alpha \int_{C_{in}} w_r(x) \, dx \quad \text{[EQ. 3]}$$

where $\Omega$ is the image domain, and s is the arc-length parameterization. The first term, the boundary term from EQ. 1, weights the length of the contour C by an edge detector function $w_b$ and penalizes fragmented and irregular contours. In the other term, $C_{in}$ designates the region inside the contour C and $w_r$ is a region-based term designed to make the segmentation robust to noise and failing edge detector functions $w_b$.

At block 450 of the core algorithm process (350), obtaining quality measures to classify an SEM image 120 as a pass or fail may include two measures. Although two specific measures are detailed below, alternate embodiments may include other distance or similarity metrics as a quality measure used to classify each SEM image 120. The first is a Hausdorf distance $d_H(C, C_o)$ between the SEM contour (C) and corresponding mask contour ($C_0$), given by:

$$d_H(C, C_0) = \max_{x \in C} \min_{y \in C_0} d(x, y) \quad \text{[EQ. 4]}$$

where d(x,y) is the Euclidean distance between points x and y. The Hausdorff distance measures the maximum distance between a point of the SEM contour (C) and any point of the mask contour ($C_0$) or the maximum deviation between the two contours. The Hausdorff distance corresponds with the worst case analysis. The other measure $d_{MSE}(C,C_0)$ is the average square distance between a point of an SEM contour (C) and the closest point of a corresponding mask contour ($C_0$). Because each of the SEM contours (C) and corresponding mask contours ($C_0$) may have different topologies, their level set representation is used to compare the contours. In order to use the level set representations, the signed distance functions $\phi_C$ and $\phi_{C0}$, associated with the closed contours with a fast marching method, are computed. The signed distance function of a contour C ($\phi_C$) determines the distance of a given point x to the contour together with its relative position. That is, the value of the signed distance function at point x is the distance to the closest point in the contour, with a positive sign for interior points and a negative sign for exterior points. The distance between a point x in the SEM contour (C) and the closest point in the mask contour ($C_0$) is given by $|\phi_{C0}(x)|$, where the sign indicates the relative position of the point with respect to the mask contour ($C_0$). The two measures of similarity of the mask contour ($C_0$) and SEM contour (C) may be computed as:

$$d_H(C, C_0) = \max_{x \in \Omega} |\phi_C(x) - \phi_{C_0}(x)| \quad [\text{EQ. 5}]$$

and $$d_{MSE}(C, C_0) = \frac{\int_\Omega |\phi_{C_0}(x)|^2 \delta(x) dx}{\int_\Omega \delta(x) dx} \quad [\text{EQ. 6}]$$

where $\delta$ is the Dirac distribution. When all the SEM contours and mask contours have the same topology and similar structures, then EQ. 6 may be approximated as follows:

$$d_{MSE}(C, C_0) \approx \int_\Omega |\phi_C(x) - \phi_{C_0}(x)|^2 dx \quad [\text{EQ. 7}]$$

Based on EQ. 5 and EQ. 6 or EQ. 7, the SEM images 120 may be classified (block 460) as a pass or fail based on two thresholds $\tau_1$ and $\tau_2$. That is, if $d_{MSE}(C,C_0)<\tau_1$, the SEM image 120 may be classified as a pass. If $d_{MSE}(C,C_0)>\tau_2$, then the SEM image 120 may be classified as a fail. Under any other circumstances, block 360 (FIG. 3) may determine that classification within a specified certainty is not possible. Thus, the scale may be reduced (block 380, FIG. 3) for further processing.

Figure 5:
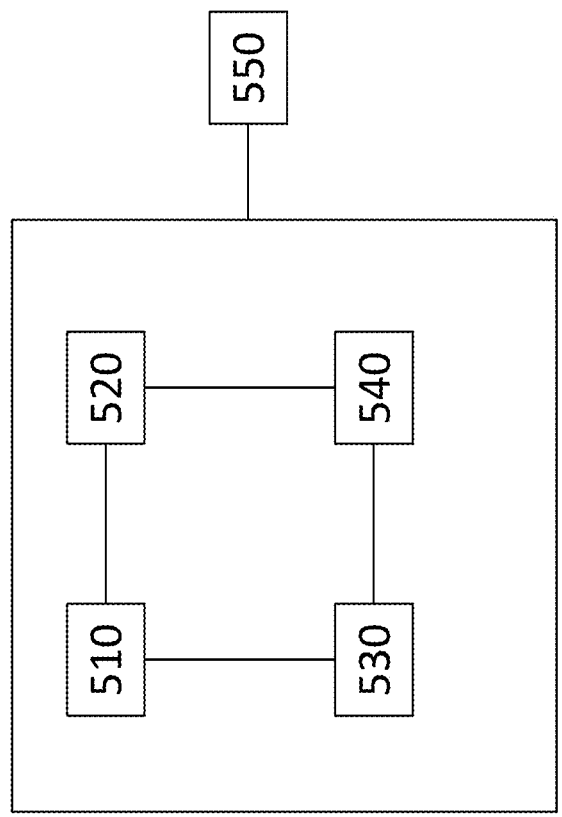
FIG. 5 is a block diagram of an exemplary computing system to automatically filter SEM images.

FIG. 5 is a block diagram of an exemplary computing system to automatically filter SEM images 120 as discussed above. The system includes one or more processors 510, one or more memory devices 520, at least one input interface 530, and at least one output interface 540. The one or more processors 510 may perform the processes detailed above based on instructions stored in the one or more memory devices 520. The input interface 530 may receive the pattern mask 110. The input interface 530 may also receive the SEM image 120 from a scanning electron microscope (SEM) 550. The output interface 540 may include a display that indicates when user intervention and manual inspection of a particular SEM image 120 is needed, for example.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of automatically evaluating a scanning electron microscope (SEM) image, the method comprising:
   obtaining, using a processor, a source image of a subject;
   obtaining, by the processor, the SEM image taken of the subject; and
   evaluating, with the processor, the SEM image based on comparing source contours extracted from the source image and SEM contours extracted from the SEM image to determine whether the SEM image passes or fails, wherein the evaluating is performed incrementally beginning at a lowest resolution of the source image and the SEM image and being performed at increasing resolutions of the source image and the SEM image when the processor does not determine whether the SEM image passes or fails according to a specified certainty.

2. The method according to claim 1, further comprising scaling, cropping, and rotating the source image to generate a processed source image to match a size and orientation of the SEM image.

3. The method according to claim 2, further comprising shifting the processed source image to match the SEM image and extracting the source contours from a resulting shifted processed source image.

4. The method according to claim 1, further comprising extracting the SEM contours based on a boundary term and a region term.

5. The method according to claim 4, wherein obtaining the boundary term is based on ridge detection applied to the SEM image and the region term is based on information from the source image.

6. The method according to claim 1, wherein the comparing a given source contour and corresponding SEM contour includes using a distance or similarity metric.

7. The method according to claim 1, wherein the evaluating is performed at a computed resolution, the computed resolution being based on a minimum distance between the source contours and a width of a band in the SEM image.

* * * * *